United States Patent [19]

Ouyang et al.

[11] Patent Number: 4,717,840
[45] Date of Patent: Jan. 5, 1988

[54] VOLTAGE LEVEL SENSING POWER-UP RESET CIRCUIT

[75] Inventors: Kenneth W. Ouyang, Huntington Beach; Melvin Marmet, Norco, both of Calif.

[73] Assignee: Western Digital Corporation, Irvine, Calif.

[21] Appl. No.: 839,501

[22] Filed: Mar. 14, 1986

[51] Int. Cl.⁴ .......................................... H03K 17/22
[52] U.S. Cl. .............................. 307/594; 307/200 B; 307/362; 307/592; 307/597
[58] Field of Search .................... 307/200 B, 443, 451, 307/354, 362, 246, 570, 584, 585, 265, 592, 594, 597, 601, 603, 605, ; 340/636, 660

[56] References Cited

U.S. PATENT DOCUMENTS

| | | | |
|---|---|---|---|
| 3,753,011 | 8/1973 | Faggin | 307/594 X |
| 3,895,239 | 7/1975 | Alaspa | 307/594 |
| 4,045,688 | 8/1977 | Stewart | 307/585 |
| 4,103,187 | 7/1978 | Imamura | 307/200 B X |
| 4,196,362 | 4/1980 | Maehashi | 307/594 X |
| 4,300,065 | 11/1981 | Remedi, et al. | 307/594 X |
| 4,385,245 | 5/1983 | Ulmer | 307/594 |
| 4,405,871 | 9/1983 | Buurma et al. | 307/594 |
| 4,409,501 | 10/1983 | Eickerman et al. | 307/585 X |
| 4,419,596 | 12/1983 | Kikuchi | 307/593 X |
| 4,441,035 | 4/1984 | Dimetriou | 307/594 X |
| 4,463,270 | 7/1984 | Gordon | 307/594 X |
| 4,503,344 | 3/1985 | Brillhart | 307/594 |
| 4,553,054 | 11/1985 | Kase et al. | 307/200 B X |
| 4,591,745 | 5/1986 | Shen | 307/592 |
| 4,607,178 | 8/1986 | Sugie et al. | 307/594 |

Primary Examiner—Stanley D. Miller
Assistant Examiner—D. R. Hudspeth
Attorney, Agent, or Firm—Spensley Horn Jubas & Lubitz

[57] ABSTRACT

A power-up reset circuit for providing a reset signal for resetting circuit elements such as flip-flops upon the application of power to the circuit includes a CMOS pair output section and a capacitor coupled to the gates of the CMOS transistors. The capacitor is charged up by the power supply to switch the reset signal to a low level after the resetting operation has been achieved. In order to accommodate slow ramping power supplies, circuitry operating as a voltage sensitive switch is included to prevent the capacitor from charging until the power supply voltage has reached a sufficient level to ensure proper operation. In order to accommodate fast ramping power supplies, the charging rate of the capacitor is controlled to assure a minimum necessary duration of the reset signal.

4 Claims, 4 Drawing Figures

SLOW RAMP

FAST RAMP

VOLTAGE LEVEL SENSING POWER-UP RESET CIRCUIT

BACKGROUND OF THE INVENTION

1. Field of the Invention

The present invention concerns power-up reset circuits for an integrated circuit and more particularly a power-up reset circuit for use as part of a monolithic integrated circuit.

2. Description of the Prior Art

When power is first applied to a variety of integrated circuits it is often desirable to reset certain circuit elements such as logic flip-flops and memory shift registers to some predetermined initial state. This circuit initialization process is commonly achieved by a power-up reset circuit which supplies an initial reset voltage signal to the various circuit elements for a brief period of time after the circuit is turned on. It is generally desirable for the power-up reset circuit to be formed on the monolithic integrated circuit chip having the circuit elements requiring initialization. However, it is also desirable to have the reset circuit occupy as little space on the chip as possible. In order for the entire integrated circuit to become functional as quickly as possible, it is advantageous to minimize the time during which the reset circuit is active to the briefest period necessary to initialize the various circuit elements. Typically reset signals need only be applied for one to one hundred microseconds.

Although reset signals may be of extremely short duration, integrated circuit power supplies generally require longer periods to begin supplying voltages at levels sufficient for circuit element initialization. In some instances a power supply may require up to ten milliseconds to reach a voltage level sufficient to reset some circuit elements. Thus power-up reset circuits must normally remain on until the power supply has achieved a desired voltage level plus some amount of time necessary to actually reset the various circuit elements.

Conventional power-up reset circuits commonly include a pair of complementary metal oxide semiconductor field effect transistors (CMOS FET's) providing an output which switches between a reset voltage supplied by the power supply and a ground or reference voltage and a resistor/capacitor series bridge for keeping the reset circuit active for a desired time period determined by the time constant of the bridge. This approach, however, suffers from a number of disadvantages. The individual resistive and capacitive elements providing a time delay sufficient to accommodate slow ramping power supplies typically occupy an undesirably large amount of monolithic integrated circuit chip space. This reduces the number of active circuit elements which can be built into the chip. Furthermore, such circuits are generally designed independent of the actual power supply with which they will operate, and proper operation can therefore not be assured. Once a conventional reset circuit is fabricated, the active period of the circuit typically remains fixed. Consequently, inadequate power-up resets my occur with power supplies that take longer to supply sufficient reset voltage levels than the fixed active period of the reset circuit. Alternatively, in situations when power supplies take less time to supply the necessary reset voltage than the predetermined reset circuit active period, the reset circuit elements still do not become fully functional until the reset circuit shuts off. Thus, there is unnecessary delay.

Thus, there exists a need for a power-up reset circuit which may be resident on a chip without taking up an undesirable amount of space and which operates for only a minimum circuit reset period after a power supply has begun supplying voltage sufficient for circuit element reset.

SUMMARY OF THE INVENTION

The present inventive circuit provides a novel power-up reset circuit responsive to the voltage output of a integrated circuit power supply so that a reset signal is provided for only a predetermined optimum reset period after the power supply has begun providing a desired reset voltage level. This inventive circuit may reside on a monolithic integrated circuit chip without occupying an undesirably large amount of space.

Generally, the circuit, in its presently preferred embodiments, includes a CMOS transistor pair bridging in series first and second voltage sources (e.g., power supply and ground) with a reset signal output obtained from a node at the junction of the two CMOS transistors. A capacitive element is connected across the second voltage source and both gates of the CMOS transistor pair. Novel voltage sensing circuits, responsive to the voltage level of the first voltage source, are employed to control the charging rate of the capacitor. At the onset of a power-up sequence the CMOS transistors are in first, opposing, conducting states allowing the output node between the CMOS pair to follow the voltage of the first voltage source. At this time the capacitor experiences a negligible amount of charging. Once the first voltage source has reached a desired reset voltage level, however, the capacitor is then charged very quickly. Once the capacitor has been charged to a predetermined level, the conducting states of the CMOS transistor pair switch, switching the reset signal output.

The novel features which are believed to be characteristic of the present invention will be better understood from the following detailed description, considered in connection with the accompanying drawings, wherein various circuits employing the present invention are described and in which like numbers denote like elements.

DETAILED DESCRIPTION OF THE INVENTION

The following description is of the best presently contemplated modes of carrying out the invention. This description is made for the purpose of illustrating the general principles of the invention and is not to be taken in a limiting sense. The scope of the invention is best determined by reference to the appended claims.

Figure 1:
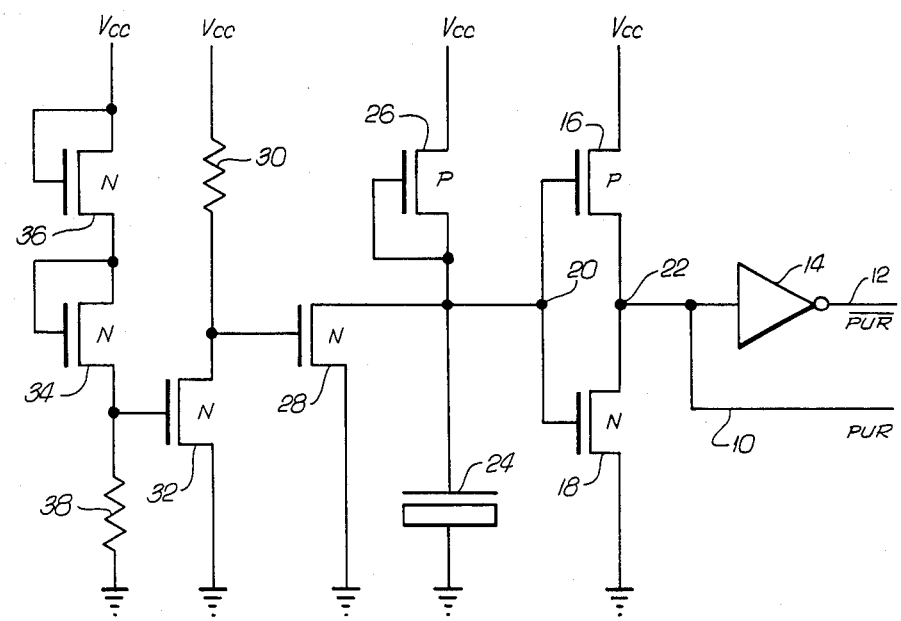
FIG. 1 is a schematic diagram of a first embodiment of the present inventive circuit.

Referring to FIG. 1, the circuit of the present invention provides an output reset pulse on line 10 and, if desired, the complement of the reset pulse on line 12 by means of an inverter 14. Initially, the power supply Vcc is turned off and everything in the circuit is at ground. When the power supply is turned on, it does not immediately obtain its nominal level (e.g., 5 volts); rather, it ramps up to this level, with the ramp time for typical power supplies varying between one-tenth of a microsecond and one hundred milliseconds.

The circuit includes an output section having a pair of complementary metal oxide semiconductor field effect transistors (CMOS FET's) 16 and 18, with the source of the P-channel transistor 16 being connected to the power supply, the source of the N-channel transistor 18 being connected to ground and the drains of the transistors being connected at terminal 22 which is coupled to the output line 10. The gates of the transistors are interconnected at 20. Before power is applied to the system both transistors 16 and 18 are non-conducting. When the power supply Vcc is turned on, it will begin ramping up toward its nominal level. When it reaches the threshold voltage of the transistor 16, i.e., the gate-to-source voltage Vgs necessary to render the transistor 16 conductive, transistor 16 will turn on, thus coupling the output line 10 to the power supply. The line 10, also indicated as PUR to represent power-up-reset, will thereafter rise along with the power supply voltage, since the drain and source of the transistor 16 are shorted. The PUR signal will thus track the power supply voltage.

An MOS capacitor 24 has one terminal connected to ground and a second terminal connected to the point 20 (and thus the gates of the transistors 16 and 18). The capacitor is provided to charge up with the power supply and, upon reaching the switching threshold of the transistor pair 16 and 18, cause the transistor 18 to turn on and the transistor 16 to turn off, thus releasing the reset signal on line 10. The remainder of the circuitry of FIG. 1 is employed to control the charging of the capacitor 24 to ensure that the desired reset signal is produced by the circuit.

The capacitor 24 is charged through a P-type MOS FET 26 having its source connected to the power supply, its drain connected to the capacitor and its gate connected to the drain in a diode connection. Thus, it will begin conducting when the power supply voltage reaches the transistor's threshold voltage.

An N-channel transistor 28 having its source connected to ground and its drain connected to the capacitor 24 and transistor 26 serves to shunt the transistor 26 and prevent the capacitor from being charged. As the power supply voltage rises, the transistor 28, whose gate is connected to the power supply via a resistor 30, will be rendered conductive. The capacitor 24 is prevented from being charged beyond the voltage across the transistor 28. This voltage is extremely low since the transistor 28 is part of a voltage divider with the transistor 26 and its equivalent resistance is extremely low compared to that of the transistor 26 since it is conductive.

In order to enable the capacitor 24 to be charged up to Vcc, the transistor 28 must be rendered nonconductive. This is accomplished by means of circuitry including N-channel transistors 32, 34 and 36 and a resistor 38. Initially, the transistors 34 and 36 will be nonconductive. There will thus be no current flow through the resistor 38 and the voltage at the gate of the transistor 32 will be zero, thereby causing it to be nonconductive. When the power supply voltage reaches the sum of the threshold voltages of the transistors 34 and 36, they will be rendered conductive and the voltage across the resistor 38 will begin to rise. When this voltage reaches the threshold voltage of the transistor 32, the transistor 32 will be rendered conductive. When this occurs, the gate voltage on the transistor 28 drops and the transistor 28 turns off. With the capacitor 24 no longer grounded, it can be charged through the transistor 26, which provides a constant current from the power supply. The capacitor 24 will be charged to the power supply voltage less the threshold voltage of the transistor 26. The capacitor will charge at a rate determined by the time constant of the RC network including the capacitor and the resistance of the transistor 26. When the voltage on the capacitor reaches the switching threshold of the transistor pair 16 and 18, it will cause the transistor 16 to turn off and transistor 18 to turn on, thereby causing the voltage at point 22 (and thus the PUR signal on line 10) to go low.

The point at which charging of the capacitor 24 is enabled is controlled by the number of series connected transistors connected to the resistor 38. As shown in FIG. 1, the transistor 32 will be rendered conductive when the power supply voltage reaches three threshold voltages. By removing one of the transistors 34 and 36, this can be changed to two threshold voltages, whereas by adding a transistor it could be increased to four threshold voltages.

Thus, the capacitor 24 is prevented from charging until the power supply voltage has reached a predetermined voltage (three threshold voltages in the illustrated embodiment). This ensures that, in the event of a slow ramping power supply, the power-up reset signal will remain at a sufficiently high level for a sufficient amount of time to provide the necessary resetting operation. In the case of a fast ramping power supply, the time constant of the capacitor network ensures that the PUR signal will remain high long enough to provide the necessary resetting operation. This circuit thus accommodates both slow ramping and fast ramping power supplies.

Figure 2:
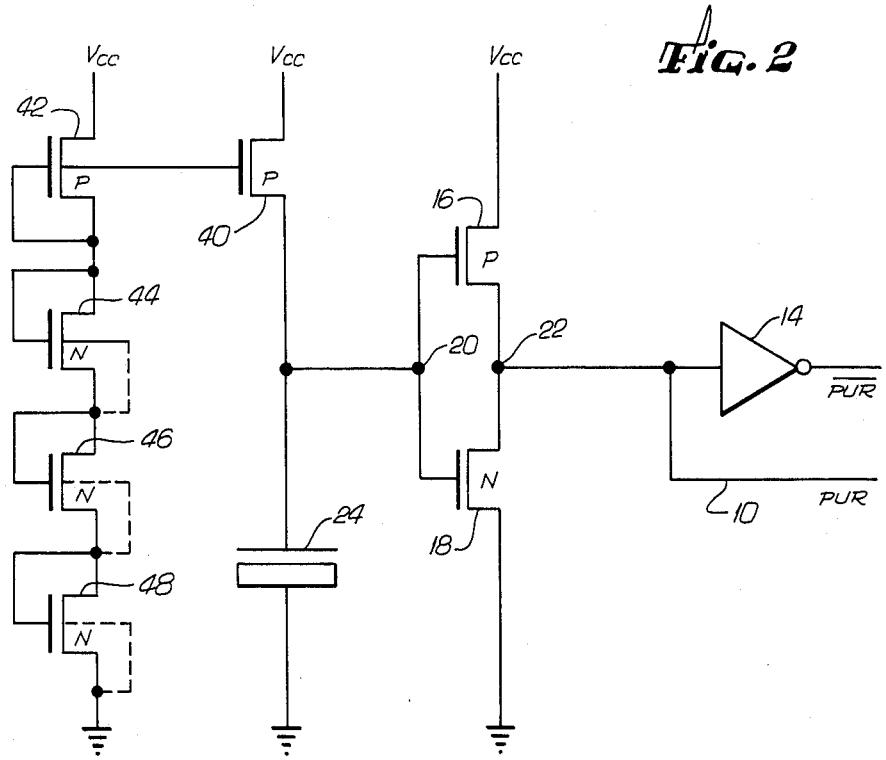
FIG. 2 is a schematic diagram of a second embodiment of the present inventive circuit.

A second embodiment of the present invention is illustrated in FIG. 2. The output section including transistors 16 and 18, and the capacitor 24 are identical to the arrangement of FIG. 1. However, the circuitry for controlling the charging of the capacitor is different. The capacitor is charged through a P-type MOS transistor 40, whose drain is connected to the capacitor 24 and source is connected to the power supply Vcc. The gate of the transistor 40 is connected to the gate of a P-type transistor 42 which is series connected to three N-type transistors 44, 46 and 48, each of which functions as a diode with its gate connected to its drain. The transistors 42-48 will turn on when the power supply voltage equals the sum of their threshold voltages. When the transistor 42 turns on, it will turn on the transistor 40 due to the current mirror connection of the transistors. The current through the transistor 40 will be proportional to the current through the transistor 42 in relation to their relative channel dimensions.

When the transistor 40 turns on, it will begin charging the capacitor 24. Once the switching threshold of the CMOS pair 16 and 18 is reached, the transistor 18 will turn on, causing the point 22 to go low. As is the case with FIG. 1, the rate of charging of the capacitor 24 is determined by the RC time constant of the capacitor and resistance of the transistor 40.

The current through the transistors 42-48 may be "fine tuned" by tying the P-well substrate to the source of the transistors 44, 46 and 48, as indicated by dashed lines in FIG. 2. Because of the current mirror configuration, the current through these transistors determines the current level through the transistor 40. Of course, as is the case with FIG. 1, the point at which charging of the capacitor 24 is enabled may be varied by deleting one or more of the transistors 44-48 or by adding additional transistors.

The circuit of FIG. 2 is simpler than that of FIG. 1 and requires less chip area since it does not need to incorporate any resistors. Otherwise, the basic operation of the two circuits is essentially identical, with the only difference being that in the embodiment of FIG. 2 the capacitor will not charge at all until the power supply reaches the sum of the thresholds of the series connected transistors, whereas in FIG. 1 the capacitor will be initially charged to the voltage across the transistor 26 (albeit very low) and will subsequently be further charged after the thresholds of the transistors 32, 34 and 36 have been exceeded by the power supply voltage.

Figure 3:
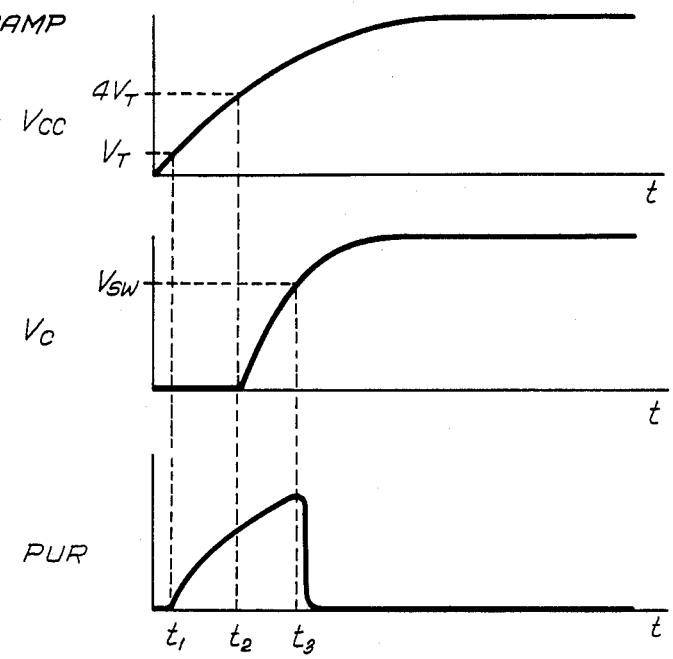
FIG. 3 is a timing diagram illustrating operation of the circuit of FIG. 2 with a fast ramping power supply.
Figure 4:
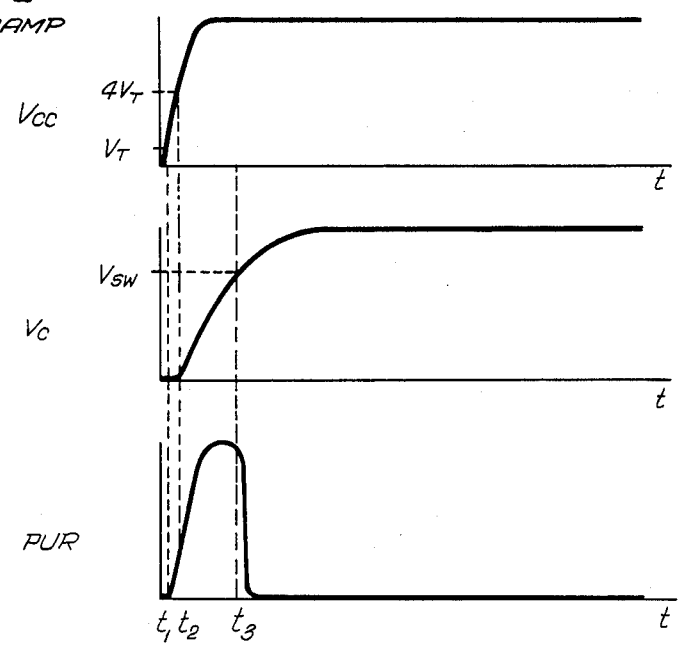
FIG. 4 is a timing diagram illustrating operation of the circuit of FIG. 2 with a slow ramping power supply.

FIGS. 3 and 4 are timing diagrams which illustrate the operation of the circuit of FIG. 2 with a slow ramping power supply and fast ramping power supply, respectively. In FIG. 3, when the power supply is turned on, its voltage Vcc rises at a relatively slow rate. When it is equal to the threshold voltage $V_T$ of the transistor 16, the PUR signal begins to track the power supply voltage. The capacitor at this point is still at zero volts since the transistor 40 is turned off. When the power supply voltage reaches four threshold voltages (the sum of the threshold voltages of the transistors 42-48), the transistor 40 will be turned on and the capacitor 24 will begin charging. The voltage Vc on the capacitor will thus increase at a rate determined by the time constant of the RC network including the capacitor 24 and the resistance of the transistor 40. When the voltage Vc reaches the switching threshold Vsw of the transistors 16 and 18, the transistor 16 will turn off and the transistor 18 turn on, thus causing the PUR signal to fall. From FIG. 3 it can be seen that the transistor 16 turns on at time $t_1$, the transistor 40 turns on at time $t_2$ and the capacitor reaches the switching threshold at time $t_3$. Even though the power supply voltage ramps up slowly, the PUR signal will not be switched low until it has been at a high enough level for sufficient time to provide the desired resetting operation. That is, by preventing the capacitor from beginning to charge until time $t_2$ it will not charge to the switching voltage until the supply voltage has achieved a high enough level for a sufficient amount of time to obtain proper resetting operation.

FIG. 4 illustrates operation with a fast ramping power supply. In this situation, the potential problem is that although the voltage Vcc rapidly rises to a level sufficient to provide the necessary resetting operation, it achieves the level so quickly that if the capacitor were allowed to quickly charge the output PUR would go low too quickly. By selecting the time constant of the RC network including the capacitor 24, the charging rate of the capacitor can be controlled so that it cannot charge so quickly that the PUR signal will not remain high for a sufficient period of time. Thus, when the threshold voltage of the transistor 16 is reached, the PUR signal will begin to track the power supply voltage, and when four threshold voltages are reached, the capacitor 24 will begin charging. However, the time constant is chosen such that the charging time up to the switching voltage Vsw is long enough so that the PUR signal will remain high for a sufficient amount of time to achieve proper resetting operation.

Thus, both slow and fast ramping power supplies are accommodated by the present invention. In addition, currents in the circuit can be controlled so as to be at a relatively low level, thereby decreasing the size requirements for the capacitor (for a given time constant), thus saving die area. By configuring the transistor 40 to provide a small current output, the capacitance value of the capacitor 24 can be decreased (compared to the value which would be required if a larger current were employed), with a resulting savings in die area.

The circuits of FIGS. 1 and 2 are comprised essentially of a CMOS output section having a capacitor coupled to the gates of the CMOS transistors and a voltage sensitive switch for preventing charging of the capacitor from occurring until the supply voltage has reached a predetermined value. This accommodates slow ramping power supplies by preventing the capacitor from charging to a point which causes the output section to switch until the supply voltage has reached a level sufficient to provide the necessary resetting operation. In addition, fast ramping power supplies are accommodated by controlling the charging rate of the capacitor so that it must charge at a rate slow enough to prevent switching of the output section until the reset signal has been high for a minimum amount of time necessary to achieve proper operation.

What is claimed is:

1. A power-up reset circuit for providing a reset signal upon the application of power to the circuit, comprising:

a power supply;

an output section including (a) a first transistor having a first terminal connected to the power supply, an output terminal and a control terminal and (b) a second transistor having a first terminal connected to ground, an output terminal connected to the output terminal of the first transistor and a control terminal connected to the control terminal of the first transistor, wherein when the power supply is turned on, its voltage will increase and render the first transistor conductive;

a capacitor having a first terminal connected to ground and a second terminal connected to the control terminals of the first and second transistors; and charging control means connected to the capacitor for causing the voltage at the second terminal of the capacitor to remain below a switching voltage which would render the first transistor non-conductive and the second transistor conductive until the power supply reaches a predetermined voltage and charging the capacitor after the power supply voltage exceeds the predetermined voltage so that the voltage at the second terminal exceeds the switching voltage, thereby rendering the first transistor non-conductive and the second transistor conductive to change the signal level at the output terminal;

wherein the charging control means includes a control transistor connected to the capacitor, wherein the control transistor is switched from a first state to a second state to initiate the charging of the capacitor; and switching control means connected to the control transistor for causing the control transistor to switch from the first state to the second state when the power supply reaches a predetermined voltage, wherein the control transistor has a supply terminal connected to the power supply and an output terminal connected to the capacitor, and wherein the switching control means includes a plurality of transistors connected in series between the power supply and ground, each transistor having a control terminal and a supply terminal interconnected, wherein the control terminal of one of the transistors is connected to the control terminal of the control transistor, said transistors of the switching control means being rendered conductive when the voltage of the power supply reaches the sum of the threshold voltages of the transitors, which in turn will cause the control transistor to be rendered conductive to charge the capacitor.

2. A power-up reset circuit for providing a reset signal upon the application of power to the circuit, comprising:

a power supply;

an output section including (a) a first transistor having a first terminal connected to the power supply, an output terminal and a control terminal and (b) a second transistor having a first terminal connected to ground, an output terminal connected to the output terminal of the first transistor and a control terminal connected to the control terminal of the first transistor, wherein when the power supply is turned on, its voltage will increase and render the first transistor conductive;

a capacitor having a first terminal connected to ground and a second terminal connected to the control terminals of the first and second transistors; and charging control means connected to the capacitor for causing the voltage at the second terminal of the capacitor to remain below a switching voltage which would render the first transistor non-conductive and the second transistor conductive until the power supply reaches a predetermined voltage and charging the capacitor after the power supply voltage exceeds the predetermined voltage so that the voltage at the second terminal exceeds the switching voltage, thereby rendering the first transistor non-conductive and the second transistor conductive to change the signal level at the output terminal;

wherein the charging control means includes a control transistor connected to the capacitor, wherein the control transistor is switched from a first state to a second state to initiate the charging of the capacitor; and switching control means connected to the control transistor for causing the control transistor to switch from the first state to the second state when the power supply reaches a predetermined voltage;

wherein the control transistor has a first terminal connected to ground, a second terminal connected to the capacitor and a control terminal; and the switching control means includes (a) a supply transistor having one terminal connected to the power supply, a second terminal connected to the capacitor and a control terminal connected to one of the first and second terminals, (b) a first resistor having one terminal connected to the power supply and a second terminal connected to the control terminal of the control transistor, (c) a shunt transistor having a control terminal, a first terminal connected to ground, and a second terminal connected to the control terminal of the control transistor, (d) a second resistor connected between the control terminal of the shunt transistor and ground, and (e) a plurality of additional transistor connected in series between the power supply and the control terminal of the shunt transistor, each transistor having a supply terminal and a control terminal interconnected, wherein when the power supply voltage exceeds the sum of the conducting threshold voltages of the shunt transistor and the additional transistors, the shunt transistor will be rendered conductive, causing the control transistor to be rendered non-conductive and enabling the capacitor to be charged by the supply transistor.

3. A power-up reset circuit for providing a reset signal upon the application of power to the circuit, comprising:

a power supply;

an output section including a first MOS transistor having its source connected to the power supply and its drain connected to an output terminal and a second MOS transistor having its source connected to ground, its drain connected to the drain of the first transistor and its gate connected to the gate of the first transistor;

a capacitor having a first terminal connected to ground and a second terminal connected to the gates of the first and second transistors; and charging control means for controlling the charging of the capacitor to cause the voltage across it to remain below a switching threshold of the output section until the supply voltage reaches a predetermined voltage and thereafter charging the capacitor toward the supply voltage, wherein the charging control means includes:

a third MOS transistor having its source connected to the power supply and its drain connected to the second terminal of the capacitor; and a plurality of MOS reference transistors connected in series between a power supply and ground, each transistor having its gate connected to its drain, whereby the reference transistors will be rendered conductive when the supply voltage reaches the sum of the threshold voltages of the transistors, wherein the gate of one of the transistors is coupled to the gate of the third MOS transistor thereby to render the third transistor conductive when the reference transistors are rendered conductive, thus charging the capacitor through the third transistor.

4. A power-up reset circuit for providing a reset signal upon the application of power to the circuit, comprising:

a power supply;

an output section including a first MOS transistor having its source connected to the power supply and its drain connected to an output terminal and a second MOS transistor having its source connected to ground, its drain connected to the drain of the first transistor and its gate connected to the gate of the first transistor;

a capacitor having a first terminal connected to ground and a second terminal connected to the gates of the first and second transistors; and charging control means for controlling the charging of the capacitor to cause the voltage across it to remain below a switching threshold of the output section until the supply voltage reaches a predetermined voltage and thereafter charging the capacitor toward the supply voltage, wherein the charging control means includes:

a third MOS transistor having its source connected to the power supply and its drain and gate connected to the second terminal of the capacitor;

a fourth MOS transistor having a gate and having its drain connected to the second terminal of the capacitor and its source connected to ground;

a first resistor having one terminal connected to the power supply and a second terminal connected to the gate of the third transistor;

a fifth MOS transistor having its drain connected to the gate of the fourth transistor and its source connected to ground;

a second resistor having one terminal connected to ground and a second terminal connected to the gate of the fifth transistor; and at least one additional MOS transistor connected in series between the power supply and the second terminal of the second resistor, each transistor having its gate connected to its drain, wherein the fifth transistor will be rendered conductive when the power supply voltage exceeds the sum of threshold voltages of the fifth transistor and the additional transistors, thereby rendering the fourth transistor non-conductive to enable the capacitor to be charged.

* * * * *